United States Patent
Hsu

(10) Patent No.: US 8,268,658 B2
(45) Date of Patent: Sep. 18, 2012

(54) LIGHT EMITTING DIODE AND METHOD FOR MAKING SAME

(75) Inventor: Chia-Ling Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 22 days.

(21) Appl. No.: 12/958,400

(22) Filed: Dec. 2, 2010

(65) Prior Publication Data

US 2012/0091433 A1 Apr. 19, 2012

(30) Foreign Application Priority Data

Oct. 18, 2010 (TW) .................................. 99135447

(51) Int. Cl.
*H01L 21/00* (2006.01)

(52) U.S. Cl. ...................... 438/34; 257/E21.09; 977/762

(58) Field of Classification Search .................... 257/13; 438/28, 29, 606, 34; 977/811, 816, 762
See application file for complete search history.

(56) References Cited

U.S. PATENT DOCUMENTS

| | | | | |
|---|---|---|---|---|
| 2003/0209992 A1* | 11/2003 | Kitamura et al. | ........... | 315/169.3 |
| 2007/0041214 A1* | 2/2007 | Ha et al. | ......................... | 362/612 |
| 2007/0235738 A1* | 10/2007 | Jin et al. | .......................... | 257/79 |
| 2009/0146142 A1* | 6/2009 | Kim et al. | ........................ | 257/43 |

* cited by examiner

*Primary Examiner* — William D Coleman
*Assistant Examiner* — Christine Enad
(74) *Attorney, Agent, or Firm* — Altis Law Group, Inc.

(57) ABSTRACT

A light emitting diode includes a substrate, a number of light emitting units formed on the substrate, and an insulating layer. Each light emitting unit includes a first electrode layer, a number of light emitting nanowires and a second electrode layer. Each light emitting nanowire includes a zinc-oxide-nanowire buffering segment extending from the first electrode layer, an N-type gallium nitride nanowire segment and a P-type gallium nitride nanowire segment. The N-type gallium nitride nanowire segment is interconnected between the zinc-oxide-nanowire buffering segment and the P-type gallium nitride nanowire segment. The P-type gallium nitride nanowire segment has a distal portion embedded in the second electrode layer. The insulating layer is formed on the substrate and the first electrode layer. The light emitting nanowires is embedded in the insulating layer and insulated from each other.

4 Claims, 8 Drawing Sheets

LIGHT EMITTING DIODE AND METHOD FOR MAKING SAME

BACKGROUND

1. Technical Field

The present disclosure relates to light emitting diodes and methods for making same.

2. Description of Related Art

Gallium nitride is a suitable material for making a blue light emitting diode. The gallium nitride is typically formed on a sapphire substrate using epitaxy technology to obtain a heterojunction structure. However, the lattice constant of sapphire is different from that of gallium nitride. This decreases a light emitting efficiency of the light emitting diode. Furthermore, sapphire is expensive and therefore, cost of the light emitting diode increases.

Therefore, a light emitting diode and a method for making the same, which can overcome the limitations described, are needed.

DETAILED DESCRIPTION

Figure 1:
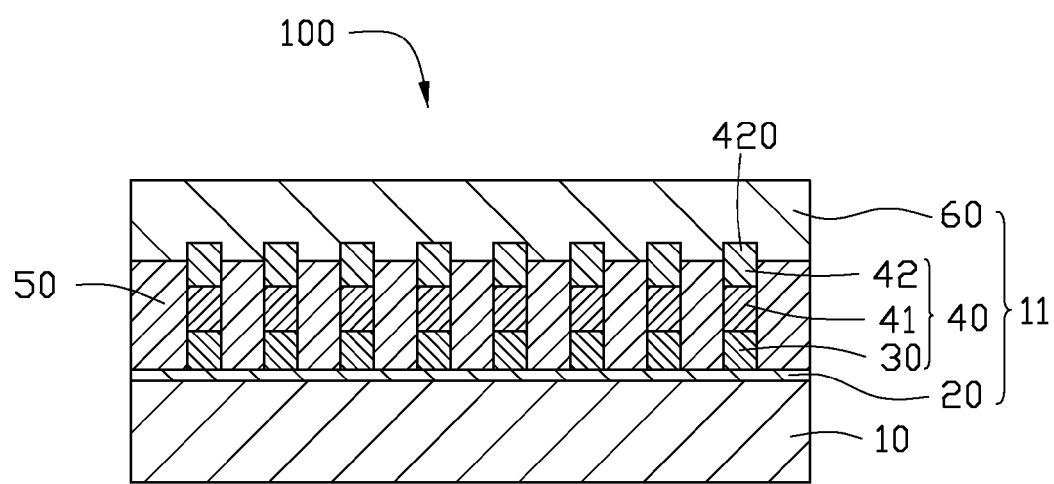
FIG. 1 is a sectional view of a light emitting diode, according to a first embodiment.

Referring to FIG. 1, a light emitting diode 100, according to a first embodiment, includes a substrate 10, a number of light emitting units 11 formed on the substrate 10, and an insulating layer 50 formed on the substrate 10. The substrate 10 may be a glass substrate or a metal substrate. The insulating layer 50 is made of insulating material, such as a silicon oxide, and the light emitting units 11 are embedded in the insulating layer 50 and insulated from each other.

Each light emitting unit 11 includes a first electrode layer 20, a number of light emitting nanowires 40, and a second electrode layer 60. The light emitting nanowires 40 are also embedded in the insulating layer 50 and insulated from each other. The insulating layer 50 is formed on the first electrode layer 20.

The first electrode layer 20 is an Al-doped zinc oxide layer. Each light emitting nanowire 40 includes a buffering segment 30, an N-type gallium nitride nanowire segment 41 and a P-type gallium nitride nanowire segment 42. The buffering segment 30 extends from the first electrode layer 20. The N-type gallium nitride nanowire segment 41 is interconnected between the buffering segment 30 and the P-type gallium nitride nanowire segment 42. Each P-type gallium nitride nanowire segment 42 has a distal portion 420 embedded in the second electrode layer 60. The second electrode layer 60 is formed on the insulating layer 50.

Material of the buffering segment 30 is zinc oxide nanowire. The zinc oxide nanowire 30 and the gallium nitride nanowire 41, 42 may be monocrystal nanowires or polycrystal nanowires. Therefore, the first electrode layer 20 and the zinc-oxide-nanowire buffering segment 30 can serve as substrates for growing the gallium nitride nanowires 41, 42 instead of using a sapphire substrate.

Referring to FIGS. 2-8, a method for making the light emitting diode 100, according to a second embodiment, includes steps S100 through S112.

Figure 2:
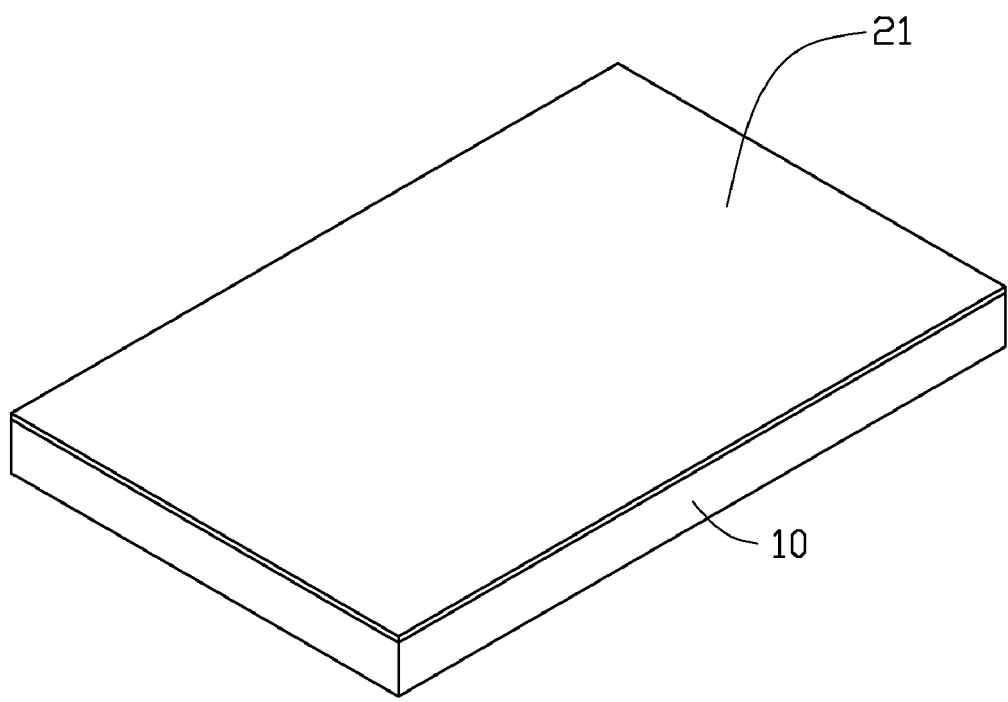
FIG. 2 to FIG. 8 are schematic views of successive stages of a method for making a light emitting diode, according to a second embodiment.

In the step S100, referring to FIG. 2, a substrate 10 is provided. In the present embodiment, the substrate 10 is a metal substrate 10. Before the substrate 10 is used, the substrate 10 is cleaned to remove contamination on the substrate 10.

In the step S102, also referring to FIG. 2, an Al-doped zinc oxide layer 21 is formed on the substrate 10 using a radio frequency sputtering process. The weight percent of the Al in the layer 21 is about 2% to make the Al-doped zinc oxide layer 21 have a desirable conductivity.

It is to be understood that the Al-doped zinc oxide layer 21 may be formed on the substrate 10 by other suitable process, such as metal organic chemical vapor deposition, molecular beam epitaxy, pulsed laser deposition or spray pyrolysis.

To ensure the Al-doped zinc oxide layer 21 has a polycrystal structure, the substrate 10 with the Al-doped zinc oxide layer 21 may be placed in a heating furnace with an atmosphere of oxygen and annealed at a temperature of about 300-500° C.

Figure 3:
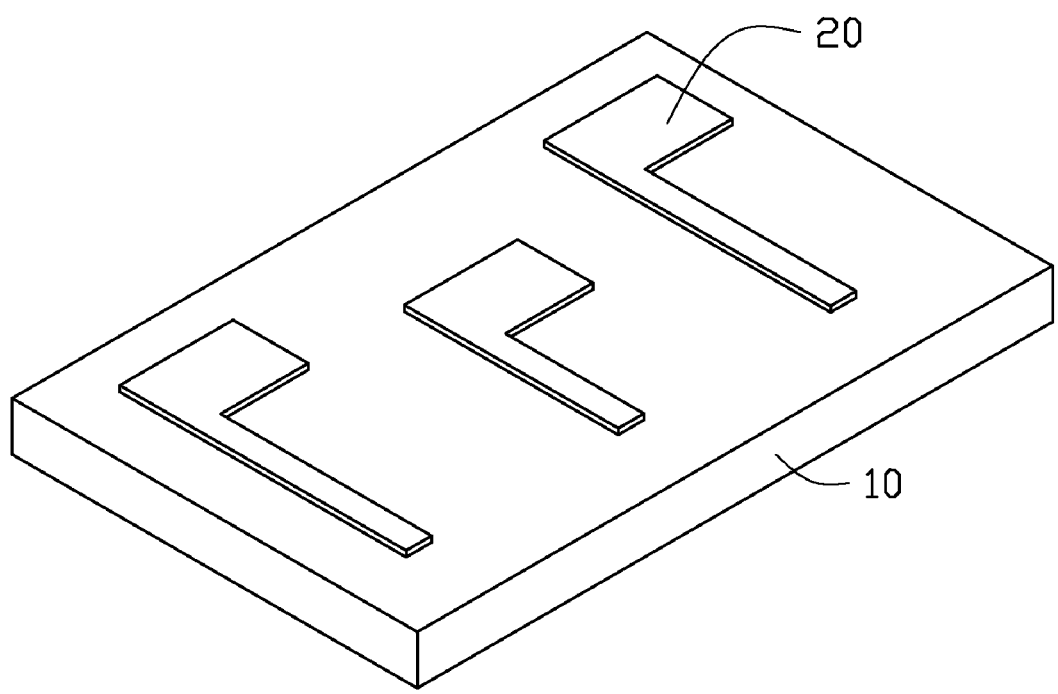

In the step S104, referring to FIG. 3 together with FIG. 2, the Al-doped zinc oxide layer 21 is etched to form a number of the first electrode layers 20. The Al-doped zinc oxide layer 21 may be etched using a photolithography process, other physical etching process or chemical etching process.

Figure 4:
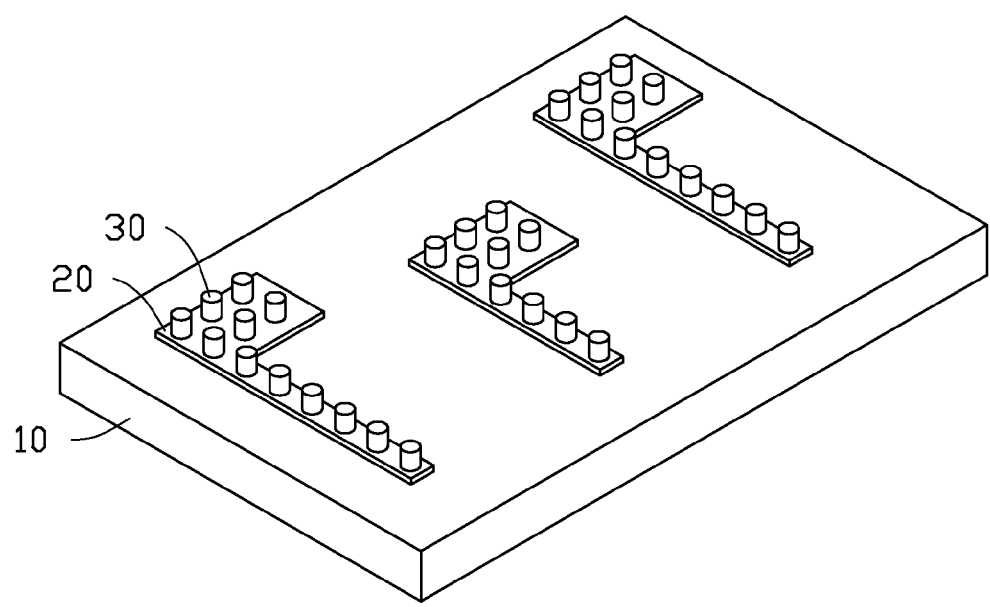

In the step S106, referring to FIG. 4, a number of zinc-oxide-nanowire buffering segments 30 are grown on each of the first electrode layers 20. In the present embodiment, the buffering segment 30 is grown on the first electrode layer 20 using a chemical vapor deposition process. During the process, first, zinc oxide nanorods are synthesized using self-catalyzed VLS (vapor-liquid-solid) process and then zinc oxide nanowires are grown on the nanorods under vapor deposition. Concentration of oxygen can be controlled to control a length of zinc oxide nanowire produced. The Al-doped zinc oxide layer 21 is used as a substrate to grow the zinc-oxide-nanowire buffering segment 30. Since the main material of the Al-doped zinc oxide layer 21 is zinc oxide and the lattice constant of zinc oxide is the same as that of the zinc oxide nanowire, the zinc-oxide-nanowire buffering segment 30 can be grown on the first electrode layer 20. It is to be understood that, the zinc-oxide-nanowire buffering segment 30 may be grown on the first electrode layer 20 using other suitable process, such as a template-assisted growth, molecular beam epitaxy process, metal-organic vapor epitaxy or metal-organic chemical vapor deposition.

Figure 5:
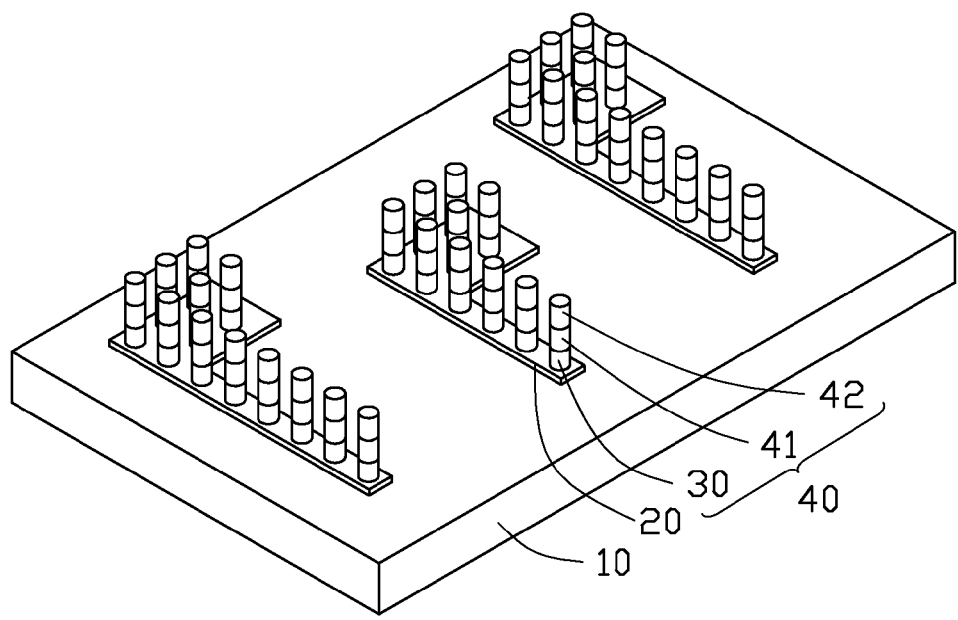

In the step S108, referring to FIG. 5, an N-type gallium nitride nanowire segment 41 and a P-type gallium nitride nanowire segment 42 are grown on each of the buffering segments 30 in that order, thereby forming a number of light emitting nanowires 40. Each light emitting nanowire 40 includes the zinc-oxide-nanowire buffering segment 30 extending from the first electrode layer 20, the N-type gallium nitride nanowire segment 41 and the P-type gallium nitride nanowire segment 42. The N-type gallium nitride nanowire segment 41 is interconnected between the zinc-oxide-nanowire buffering segment 30 and the P-type gallium nitride nanowire segment 42. In the present embodiment, the N-type gallium nitride nanowire segment 41 and the P-type gallium nitride nanowire segment 42 are grown on the zinc-oxide-nanowire buffering segment 30 using the chemical vapor deposition process. Since the lattice constant of gallium nitride is close to that of the zinc oxide, the gallium nitride nanowire segment 41 can be grown on the zinc-oxide-nanowire buffering segment 30. Therefore, the buffering segment 30, the N-type gallium nitride nanowire segment 41 and the P-type gallium nitride nanowire segment 42 form a light emitting nanowire 40 on the first electrode layer. It is to be understood that the N-type gallium nitride nanowire segment 41 and the P-type gallium nitride nanowire segment 42 can be grown using the other suitable process, such as plasma-assisted chemical vapor deposition.

Figure 6:
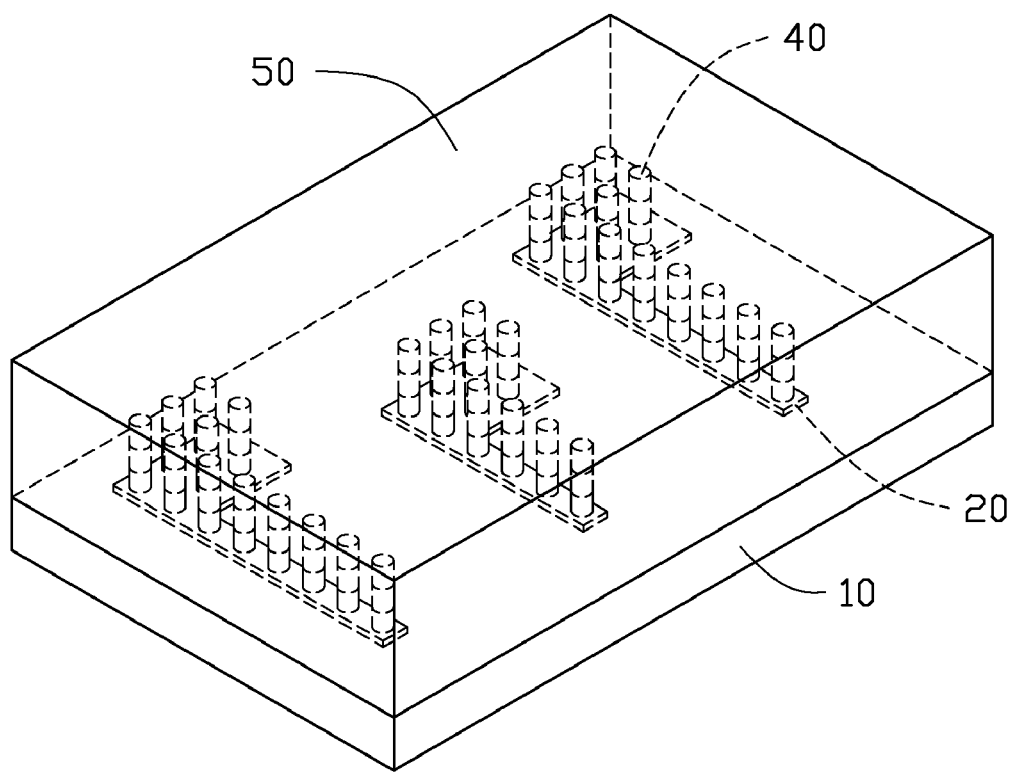
Figure 7:
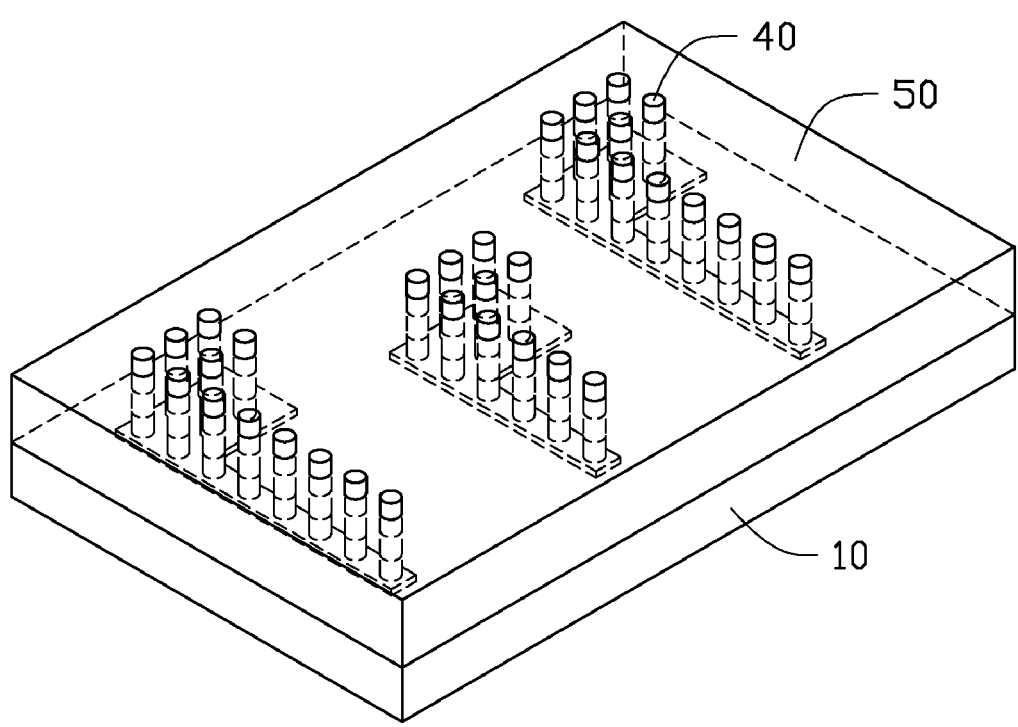

In the step S110, referring to FIGS. 6-7, an insulating layer 50 is formed on the substrate 10 and the first electrode layers 20 to embed the light emitting nanowires 40 therein with each of the P-type gallium nitride nanowire segment 42 having a distal portion 420 exposed from the insulating layer 50. Material of the insulating layer 50 is silicon dioxide.

Referring to FIG. 6, first, the insulating layer 50 is deposited on the substrate 10 to cover the light emitting nanowire 40 completely. Second, the insulating layer 50 is etched from the top down until the distal portion 420 of the P-type gallium nitride nanowire segment 42 is exposed. It is to be understood, in alternative embodiments, a deposition speed of the insulating layer 50 can be controlled to expose the distal portion 420 of the P-type gallium nitride nanowire segment 42 and the step of etching the insulating layer 50 can be omitted.

Figure 8:
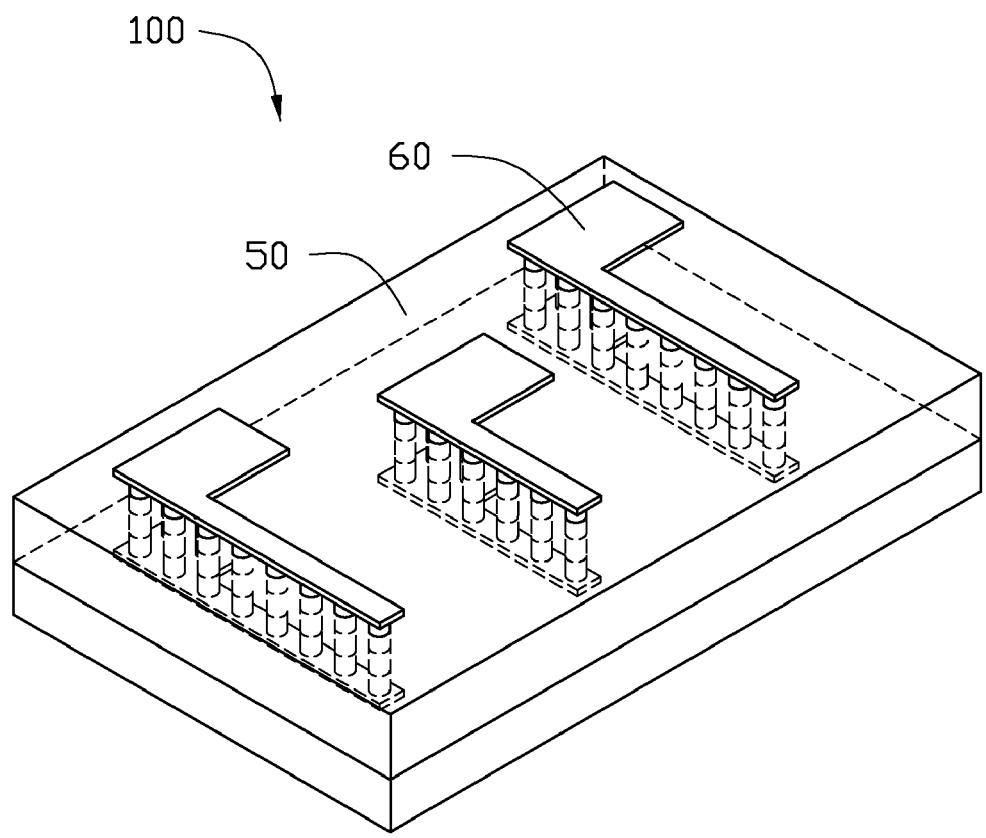

In the step S112, referring to FIG. 8, a number of second electrode layers 60 are formed on the insulating layer 50 to cover the distal portions 420 of the P-type gallium nitride nanowire segments 42. Each second electrode layer 60 spatially corresponds to the first electrode layer 20. In the present embodiment, material of the second electrode layer 60 is indium tin oxide. The second electrode layer 60 can be formed using the chemical vapor deposition process. In alternative embodiments, material of the second electrode layer 60 may be carbon nanotube.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for making a light emitting diode, comprising steps of:
    providing a substrate;
    forming an Al-doped zinc oxide layer on the substrate;
    etching the Al-doped zinc oxide layer to form a plurality of first electrode layers;
    growing a plurality of zinc-oxide-nanowire buffering segments on each of the first electrode layers;
    growing an N-type gallium nitride nanowire segment on each of the zinc-oxide-nanowire buffering segment;
    growing a P-type gallium nitride nanowire segment on the N-type gallium nitride nanowire segment, thereby, forming a plurality of light emitting nanowires on the first electrode layer, each light emitting nanowire comprising the zinc-oxide-nanowire buffering segment, the N-type gallium nitride nanowire segment and the P-type gallium nitride nanowire segment;
    forming an insulating layer on the substrate and the first electrode layers to embed the light emitting nanowires therein with each of the P-type gallium nitride nanowire segment having a distal portion exposed from the insulating layer; and
    forming a plurality of second electrode layers on the insulating layer to cover the distal portions of the P-type gallium nitride nanowire segments, each second electrode layer spatially corresponding the respective first electrode layer.

2. The method of claim 1, wherein the substrate is a glass substrate or a metal substrate.

3. The method of claim 1, wherein the Al-doped zinc oxide layer is formed on the substrate using a radio frequency sputtering process.

4. The method of claim 1, wherein the zinc-oxide-nanowire buffering segment, the N-type gallium nitride nanowire segment and the P-type gallium nitride nanowire segment are grown using a chemical vapor deposition process.

* * * * *